(12) United States Patent
Singh et al.

(10) Patent No.: US 11,078,380 B2
(45) Date of Patent: Aug. 3, 2021

(54) HARD ABRASIVE PARTICLE-FREE POLISHING OF HARD MATERIALS

(71) Applicants: ENTEGRIS, INC., Billerica, MA (US); UNIVERSITY OF FLORIDA RESEARCH FOUNDATION, INC., Gainesville, FL (US)

(72) Inventors: Rajiv K. Singh, Newberry, FL (US); Arul Arjunan, Gainesville, FL (US); Deepika Singh, Newberry, FL (US); Chaitanya Ginde, Gainesville, FL (US); Puneet N. Jawali, Gainesville, FL (US)

(73) Assignees: Entegris, Inc., Billerica, MA (US); University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 15/645,777

(22) Filed: Jul. 10, 2017

(65) Prior Publication Data
US 2019/0010356 A1 Jan. 10, 2019

(51) Int. Cl.
*C09G 1/00* (2006.01)
*C09K 13/00* (2006.01)
(Continued)

(52) U.S. Cl.
CPC .............. *C09G 1/02* (2013.01); *B24B 37/00* (2013.01); *B24B 37/044* (2013.01); *C09G 1/04* (2013.01);
(Continued)

(58) Field of Classification Search
CPC ... C09G 1/00; C09G 1/02; C09G 1/04; C09K 13/00; C09K 13/02; C09K 13/04
See application file for complete search history.

(56) References Cited

U.S. PATENT DOCUMENTS 6,299,795 B1 10/2001 Liu
8,105,135 B2 1/2012 Laconto et al.
(Continued)

FOREIGN PATENT DOCUMENTS

CN 1333317 A 1/2002
CN 1735670 A 2/2006
(Continued)

OTHER PUBLICATIONS

Alcalá, Mechanical properties of amorphous anodic alumina and tantala films using nanoindentation, Nanotechnology, vol. 13, No. 4, published May 28, 2002.
(Continued)

*Primary Examiner* — Thomas T Pham
(74) *Attorney, Agent, or Firm* — Entegris, Inc.

(57) ABSTRACT

A method of CMP includes providing a slurry solution including ≥1 per-compound oxidizer in a concentration between 0.01 M and 2 M with a pH from 2 to 5 or 8 to 11, and ≥1 buffering agent which provides a buffering ratio ≥1.5 that compares an amount of a strong acid needed to reduce the pH from 9.0 to 3.0 as compared to an amount of strong acid to change the pH from 9.0 to 3.0 without the buffering agent. The slurry solution is exclusive any hard slurry particles or has only soft slurry particles that have throughout a Vickers hardness <300 Kg/mm² or Mohs Hardness <4. The slurry solution is dispensed on a hard surface having a Vickers hardness >1,000 kg/mm² is pressed by a polishing pad with the slurry solution in between while rotating the polishing pad relative to the hard surface.

6 Claims, 2 Drawing Sheets

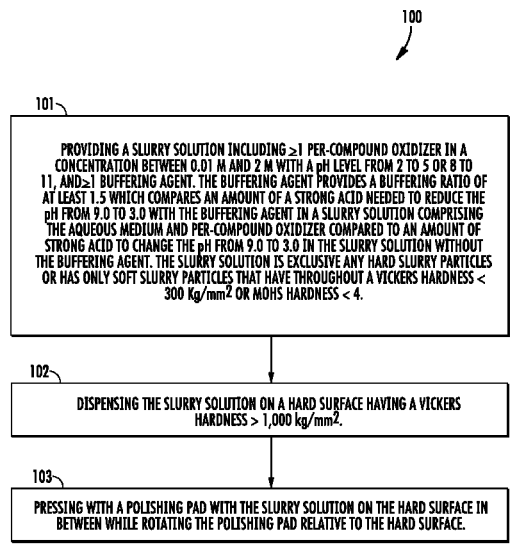

(51) Int. Cl.
C09G 1/02 (2006.01)
C09K 3/14 (2006.01)
H01L 21/306 (2006.01)
H01L 21/321 (2006.01)
B24B 37/00 (2012.01)
B24B 37/04 (2012.01)
C09G 1/04 (2006.01)
H01L 21/02 (2006.01)

(52) U.S. Cl.
CPC ...... *C09K 3/1409* (2013.01); *H01L 21/02024* (2013.01); *H01L 21/30625* (2013.01); *H01L 21/3212* (2013.01)

(56) References Cited

U.S. PATENT DOCUMENTS

| | | |
|---|---|---|
| 8,828,874 B2 | 9/2014 | Singh et al. |
| 9,259,818 B2 | 2/2016 | Singh et al. |
| 9,259,819 B2 | 2/2016 | Singh et al. |
| 9,368,367 B2 | 6/2016 | Singh et al. |
| 9,567,492 B2 | 2/2017 | Singh et al. |
| 2004/0161932 A1* | 8/2004 | Matsui ............ C09G 1/02 438/689 |
| 2004/0175942 A1 | 9/2004 | Chang |
| 2006/0030158 A1 | 2/2006 | Carter |
| 2006/0236922 A1* | 10/2006 | Ishibashi ............ C09G 1/02 117/94 |
| 2009/0317638 A1* | 12/2009 | Kawabata ............ C09K 3/1463 428/409 |
| 2010/0227767 A1* | 9/2010 | Boedicker ............ C12M 1/14 506/7 |
| 2011/0103133 A1 | 5/2011 | Okada |
| 2017/0248305 A1* | 8/2017 | Avalos-Garcia ........ B01J 8/00 |
| 2018/0085888 A1 | 3/2018 | Hendron |
| 2018/0340095 A1 | 11/2018 | Ward |
| 2019/0300821 A1 | 10/2019 | Yoshizaki |

FOREIGN PATENT DOCUMENTS

| | | |
|---|---|---|
| EP | 2767569 A1 | 8/2014 |
| EP | 3216839 A1 | 9/2017 |
| EP | 2767568 B1 | 12/2018 |
| JP | 2016094588 | 5/2016 |
| WO | 2014173934 | 10/2014 |

OTHER PUBLICATIONS

Barai et al., Synthesis of amorphous manganese oxide nanoparticles-to-crystalline nanorods through a simple wet-chemical technique using K+ ions as a 'growth director' and their morphology—controlled high performance supercapacitor applications, RSC Adv., 2016, 6, 78887.

\* cited by examiner

```
                                          100
                                         ↙

101
  ┌─────────────────────────────────────────────────────────────────┐
  │   PROVIDING A SLURRY SOLUTION INCLUDING ≥1 PER-COMPOUND OXIDIZER IN A │
  │   CONCENTRATION BETWEEN 0.01 M AND 2 M WITH A pH LEVEL FROM 2 TO 5 OR 8 TO │
  │   11, AND ≥1 BUFFERING AGENT. THE BUFFERING AGENT PROVIDES A BUFFERING RATIO OF │
  │   AT LEAST 1.5 WHICH COMPARES AN AMOUNT OF A STRONG ACID NEEDED TO REDUCE THE │
  │   pH FROM 9.0 TO 3.0 WITH THE BUFFERING AGENT IN A SLURRY SOLUTION COMPRISING │
  │   THE AQUEOUS MEDIUM AND PER-COMPOUND OXIDIZER COMPARED TO AN AMOUNT OF │
  │   STRONG ACID TO CHANGE THE pH FROM 9.0 TO 3.0 IN THE SLURRY SOLUTION WITHOUT │
  │   THE BUFFERING AGENT. THE SLURRY SOLUTION IS EXCLUSIVE ANY HARD SLURRY PARTICLES │
  │   OR HAS ONLY SOFT SLURRY PARTICLES THAT HAVE THROUGHOUT A VICKERS HARDNESS < │
  │                   300 Kg/mm² OR MOHS HARDNESS < 4.               │
  └─────────────────────────────────────────────────────────────────┘
                                    │
                                    ▼
  102
  ┌─────────────────────────────────────────────────────────────────┐
  │      DISPENSING THE SLURRY SOLUTION ON A HARD SURFACE HAVING A VICKERS │
  │                        HARDNESS > 1,000 kg/mm².                  │
  └─────────────────────────────────────────────────────────────────┘
                                    │
                                    ▼
  103
  ┌─────────────────────────────────────────────────────────────────┐
  │   PRESSING WITH A POLISHING PAD WITH THE SLURRY SOLUTION ON THE HARD SURFACE IN │
  │     BETWEEN WHILE ROTATING THE POLISHING PAD RELATIVE TO THE HARD SURFACE.  │
  └─────────────────────────────────────────────────────────────────┘

FIG. 1
```

| KMnO4 CONCENTRATION (MOLE/LITRE) | GaN-Ga-FACE-@-pH-7.2-REMOVAL-RATE (nm/h) | SiC-Si-FACE-pH-7.2-REMOVAL-RATE (nm/h) | SiC-C-FACE-pH-7.2-REMOVAL-RATE (nm/h) | GaN-@-pH-1.5-REMOVAL-RATE (nm/h) | SiC-Si-FACE-@-pH-2.0-REMOVAL-RATE (nm/h) | SiC-C-FACE-@-pH-2.5-REMOVAL-RATE (nm/h) | SiC-C-FACE-@-pH-12.5-REMOVAL-RATE (nm/h) | DIAMOND-pH-1.5-REMOVAL-RATE (nm/h) | POLY-CRYSTALLINE-SiC-pH-2-REMOVAL-RATE (nm/h)-SiC |
|---|---|---|---|---|---|---|---|---|---|
| 0 | 10 | 0 | 0 | 5 | 0 | 0 | 0 | 0 | 0 |
| 0.01 | 30 | 15 | 122 | 60 | 180 | 1945 | 100 | 1 | 1050 |
| 0.40 | 0 | 483 | 2931 | 306 | 675 | 4921 | 3024 | 3 | 5060 |
| 1.0 | 10 | 550 | 3050 | 325 | 712 | 5000 | 3500 | 3 | 5600 |
| 3.0 | 12 | 574 | 3161 | 349 | 750 | 5183 | 3625 | 7 | 5701 |

FIG. 2

HARD ABRASIVE PARTICLE-FREE POLISHING OF HARD MATERIALS

FIELD

Disclosed embodiments relate to chemical mechanical polishing (CMP) for polishing hard material surfaces of semiconductors or on semiconductors.

BACKGROUND

Hard metal layers used in semiconductor wafer fabrication such as tungsten, iridium, and ruthenium that have a Vickers Hardness exceeding 1,000 Kg/mm$^2$ and typically do not react readily with chemicals such as oxidizers used in CMP resulting in a low CMP removal rate. Hard non-metal layers having a Vickers hardness exceeding 1,000 Kg/mm$^2$ are also typically non-reactive again leading to a low CMP removal rate. Examples of hard non-metals include diamond and some nitrides (e.g., GaN, AlN or their mixtures), some carbides (e.g., SiC), some oxides of elements in the Group III of the periodic table, as well as carbide, oxides and nitrides or mixtures thereof of metals in rows 3, 4, 5, 6 of the periodic table. Because of their hardness, materials having a Vickers hardness greater than 1,000 Kg/mm$^2$ typically all require hard abrasive particles such as silica, alumina or diamond to enable polishing with a reasonable polishing rate.

SUMMARY

This Summary briefly indicates the nature and substance of this Disclosure. It is submitted with the understanding that it will not be used to interpret or limit the scope or meaning of the claims.

Disclosed embodiments recognize slurries having typical hard abrasive particles for polishing hard materials such as SiC, GaN and metals such as ruthenium and tungsten can provide reasonably high polishing rates, but cause significant surface and sub-surface damage. Slurries with moderately hard particles which are softer than such hard surfaces typically provide low polishing rates, with significantly less damage. However, since the moderately hard particles are still significantly abrasive (having a Mohs hardness of about 6 to 10), crystal damage is generated during the CMP process. Moreover, since such hard materials are generally chemically inert, the CMP process typically is very slow and thus requires a long cycle time as the slurry chemicals do not react with the hard surface. Therefore, there is a need to develop new CMP slurries and/or methods for polishing hard surfaces which decrease crystal damage and increase the polishing rate as compared to conventional hard abrasive particles-based slurries.

Disclosed embodiments includes a method of CMP include providing a slurry solution including at least one per-compound oxidizer with a pH level from 2 to 5 or 8 to 11, and at least one buffering agent. The buffering agent provides a buffering ratio of at least 1.5 which compares an amount of a strong acid needed to reduce the pH of the slurry solution from 9.0 to 3.0 with the buffering agent compared to an amount of strong acid to change the pH of the slurry solution from 9.0 to 3.0 without the buffering agent. The slurry solution is exclusive any hard slurry particles or has only soft slurry particles that have throughout a Vickers hardness less than 300 Kg/mm$^2$ or Mohs Hardness less than 4. A hard surface is defined herein as a material having a Vickers hardness >1,000 kg/mm$^2$ is pressed with a polishing pad with the slurry solution in between while rotating the polishing pad relative to the hard surface.

BRIEF DESCRIPTION OF THE DRAWINGS

FIG. 1 is a flow chart that shows steps for an example method of hard abrasive particle-free polishing of hard materials, according to an example embodiment.

FIG. 2 is a table showing experimental hard abrasive particle-free polishing data results corresponding to Example 1.

DETAILED DESCRIPTION

Embodiments of the invention are described with reference to the attached figures, wherein like reference numerals are used throughout the figures to designate similar or equivalent elements. The figures are not drawn to scale and they are provided merely to illustrate certain features. Several aspects of this Disclosure are described below with reference to example applications for illustration.

It should be understood that numerous specific details, relationships, and methods are set forth to provide a full understanding of the subject matter in this Disclosure. One having ordinary skill in the relevant art, however, will readily recognize that embodiments of the invention can be practiced without one or more of the specific details or with other methods. In other instances, well-known structures or operations are not shown in detail to avoid obscuring subject matter. Embodiments of the invention are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed embodiments include a CMP slurry that is hard abrasive particle-free and a related method of hard abrasive particle-free polishing of hard wafer surfaces having a Vickers hardness >1,000 Kg/mm$^2$. The slurry comprises an aqueous solution medium including at least one per-compound oxidizer, where the slurry lacks any hard abrasive particles that are conventionally required as known in the art of CMP for the polishing of hard materials. Hard abrasive particles which are excluded from disclosed slurries are defined herein as having Vickers hardness >500 Kg/mm$^2$ or Mohs hardness greater than 6, such as silica, alumina, diamond, or titania.

A per-based compound as used herein is a compound that includes an element in its highest oxidation state. Some per-compound oxidizers include transition metal compounds, such as permanganate ($MnO_4^-$), and some non-transition elements such as perchlorate ($ClO_4^-$). Optionally, the slurry solution can also include transition metal ions besides those that may be in the per-compound oxidizers in a concentration from 0.03 M to 1 M, as well as optional chelating agents such as ethylenediamine tetraacetic acid (EDTA), or corrosion inhibitors such azoles and amines.

Examples of transition metal elements in disclosed per-compound oxidizers include cerium, manganese, chromium, titanium, iron, cobalt, copper, zinc, nickel, and vanadium. Typical examples of per-compound types include permanganate, peroxide, perchlorate, and persulfate compounds. One particular per-compound type is an alkali metal (e.g., sodium, lithium, potassium) of permanganate, or a mixture of a per-compound with one component being a permanganate.

Examples of specific per-compound oxidizers include Potassium Permanganate ($KMnO_4$), sodium Permanganate ($NaMnO_4$), Potassium Perchlorate ($KClO_4$), Potassium Periodate ($KIO_4$), Potassium Perbromate ($KBrO_4$), Potassium Peroxide ($K_2O_2$), Potassium Peroxoborate ($KBO_3$), Potassium Peroxochromate ($K_3CrO_8$), Potassium Peroxodicarbonate ($K_2C_2O_6$), Potassium Peroxodisulfate ($K_2S_2O_8$), Potassium Perrhenate ($KReO_4$), Potassium peroxymonosulfate ($KHSO_5$), Potassium Ortho Periodate ($K_5IO_5$), and Potassium peroxomonosulfate (or Peroxymonosulfate) ($K_2SO_5$). The oxidation state of manganese in permanganate is +7, which is the highest oxidation state for manganese. Similarly the oxidation state for chlorine in chlorate is +7, which is its highest oxidation state. The oxidation state of the transition metal or per-based oxidizer can be at least +3, or higher. Examples of +3 or higher oxidation state transition metals include $V^{3+,4+,5+}$, $Ti^{3+, 4+}$, $Cr^{3+, 6+}$, $Mn^{+3+, 4+, 7+}$, $Fe^{3+}$, $Ni^{3+}$, $Co^{3+}$, $Mo^{3+, 4+, 5+, 6+}$, $Ru^{3+, 4+}$, $Pd^{4+}$, $Ta^{4+, 5+}$, $W^{6+}$, $Re^{4+, 6+, 7+}$, $Au^{3+}$, and $Zr^{4+}$. A mixture of per-compound oxidizers can also be used. The concentration of per-compound oxidizers can vary from 0.01 M to 10 M or up to maximum solubility of the per-based compound at an elevated CMP temperature used (e.g., 70° C.), but is typically between 0.01 M and 4 M, such as between 0.1 M and 2 M.

Examples of hard metals for disclosed polishing include Ir, W, Ta, and Hf. Examples of hard non-metal materials include carbides such as SiC, nitrides such as GaN, AlGaN, and AlN, diamond, and non-metals containing either nitrogen, carbon or a mixture of both nitrogen and carbon. The pH of the slurry solution can vary from 0.5 to 13.5, generally being from 2 to 5 in the acidic pH range and 8 to 11 in the basic pH range. The pH of the slurry can be adjusted by adding either inorganic acids or bases. Examples of strong inorganic acids include nitride acid, sulfuric acid, phosphoric acid, and hydrochloric acid. Examples of organic acids include acetic acid, formic acid, and citric acid. Examples of inorganic bases include alkali (sodium, potassium, ammonium, lithium) based hydroxides. Examples of organic bases include TMAH (Tetramethyl ammonium hydroxide) and other hydroxides.

During polishing the hard material on the wafer surface is rubbed by a polymeric, metallic or a ceramic pad with the hard material having a relative velocity with respect to the polishing pad. This relative velocity can vary from 0.01 m/sec to 100 m/sec with a typical range of 0.2 m/s to 4 m/s. The pressure during CMP can vary from 0.1 psi to 100 psi, with a typical range from 1 psi to 10 psi. Examples of polymeric pads include polyurethane-based pads, and other polymeric materials that generally all have a Shore D hardness of less than 100. The porosity of the pads can vary from 0.01% to 99% with a typical range from 10% to 50%. The density of the pads can vary from 0.4 $gm/cm^3$ to 1.0 $gm/cm^3$. Examples of metal pads include cast-iron, copper, tin, and a copper-polymer composite. Examples of ceramic pads include silica, glass, alumina, sapphire pads and other ceramic materials with a Vickers hardness exceeding 500 $Kg/mm^2$.

The buffering agent can provide several beneficial functions during the polishing process. The buffering agent keeps the pH of the slurry solution stable during the polishing process and also helps to increase the polishing rate as compared to un-buffered oxidizers especially in the pH range of 3 to 10. This is an unexpected result as conventionally the addition of such additives reduces the polishing rate. A buffering agent is defined herein as a material which increases the amount of strong acid such as nitric acid, sulfuric acid, or hydrochloric acid needed to change the pH of the slurry solution from 9.0 to 3.0. The buffering ratio (referred to herein as the BR ratio) refers to amount of strong acid required when changing the pH of the slurry solution containing the buffering agent as compared to the amount of strong acid required to change the pH from 9 to 3.0 of the slurry solution containing no buffering agent. By adding a buffering agent to the slurry solution the BR value can be between 1.1 and 200, with a typical BR value range from 2 to 20, such as from 2 to 10.

Examples of buffering agents include colloidal particles of soft abrasives where soft abrasives are defined herein as an abrasive with a Mohs hardness less than 4 or a Vickers hardness less than 300 $Kg/mm^2$, organic compounds including polymers containing at least one hydroxyl (OH) group with a concentration ranging from 0.001 g/liter of per solution to 100 g/liter having a typical range from 0.05 gm/liter to 9 gm/liter, and surfactants or surface active polymers having a molecular weight exceeding 100 Daltons with a concentration from 0.0001 g/liter of per-compound to 100 gm/liter with typical concentration range from 0.1 gm/liter to 5 gm/liter. Other buffering agents include mixtures of strong acids (examples nitric acid, hydrochloric acid, and sulfuric acid) or strong bases (sodium hydroxide, or potassium hydroxide) mixed with weakly disassociating compounds which have pKa (the acid dissociation constant at logarithmic scale) ranging from 2.0 to 10.0 such as citric acid, acetic acid, oxalic acid, phosphates, and borates with the concentration of the weak disassociating compounds in the slurry solution varying from 0.1 gram/liter to 100 gram/liter such as 0.5 gram/liter to 10 grams/liter.

The slurry solution can also include transition metal ions besides the per-based oxidizer such as manganese, copper, titanium, transition mixed metal ions of manganese with valence varying from +2 to +7 with concentration varying from 0.001 M to 10 M with typical range of 0.02M to 0.3 M. The transition metal ions in the slurry solution together with transition metal ions that may be in the per-compound oxidizer can together function as a buffering agent when including at least 2 valences of manganese selected from 2+, 3+, 4+, and 7+ with total manganese ion concentration typically not exceeding 2.0 moles/liter.

A variety of surfactants can also be added to disclosed slurries as a buffering agent selected from cationic, anionic, zwitterionic or non-ionic ones. The surfactants can be used individually or in a mixed state. A list of surfactants that can be used with the invention are provided in a book by M. J. Rosen, Surfactants and Interfacial Phenomena, John Wiley & Sons, 1989, hereinafter Rosen, on pages 3-32, 52-54, 70-80, 122-132, and 398-401. The concentration of surfactants can vary from 0.0001 g/liter to 100 gm/liter with typical concentration range from 0.1 gm/liter to 5 gm/liter. The BR was found to change from 1.0 to greater than 2.5 with the addition of a non-ionic surfactant. Furthermore the increase in the BR ratio also leads to an increase in the removal rate during the polishing of hard metals and non-metals.

The non-ionic surfactants can comprise polyethylene glycol ethers, polypropylene glycol alkyl ethers, glucoside alkyl ethers, polyethylene glycol octylphenyl ethers, polyethylene glycol alkylphenyl ethers, glycerol alkylesters, polyoxyehylene glycol sorbitan alkyl esters, sorbitan alkyl esters, cocamide, dodeceyldimethylamine oxide, block copolymers of polyethylene glycol and poly propylene glycol, polyethoxylated tallow amine. Examples of specific non-ionic surfactants include TX-100 or BRIJ 35 (a polyethylene glycol dodecyl ether, Polyoxyethylene (23) lauryl ether). The concentration of the non-ionic surfactants should generally be at least 0.001 mg/liter to a maximum value of 50 g/liter in solution, such as in a range from 0.03 gm/liter to 5 gm/liter.

As describe above, the slurry solution can also include organic compounds having OH groups compounds as the buffering agent. Examples include organic acids, alcohols, amines (e.g., bicine, TEA) or compounds having a chemical formula represented by $RCH_2OH$ where R, represent a carbon containing group such as $H_{21}C_{10}$—$CH_2$—$CH_2$—$[C_2H_4]_{22}$—O—$CH_2$— in the case of a non-ionic surfactant (e.g. BRIJ-35) or containing from 3 to up to 70 carbon atoms. The organic compound concentration should generally be at least 0.001 mg/liter up to a maximum value of 50 g/liter, such as a range of 0.1 gm/liter to 5 gm/liter.

As noted above the slurry solution can also include colloidal particles of soft abrasives as the buffering agent. Examples include polymeric particles, zinc oxide, and manganese dioxide with particle size range from 10 nm to 100 microns with typical range from 100 nm to 10 microns. The concentration of colloidal particles of soft abrasives should generally be at least 0.1 g/liter to a maximum value of 300 gm/liter of slurry solution, with typical range from 0.1 gm/liter to 50 gm/liter. The soft slurry particles can have a negative zeta potential at a pH of 6.0 or below.

The addition of buffering organic compounds such as having the formula $RCH_2OH$ together with per-compound oxidizers can lead to formation of intermediate compounds in the slurry due to in-situ chemical reactions. An example of an in-situ chemical reaction is given below where $RCH_2OH$ functions as a buffering agent:

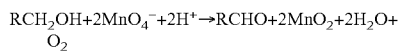

where R is a carbon containing organic group. Due to this chemical reaction the RCHO group may also act as buffering agent. Thus the polishing slurry may contain an RCHO group in addition to a $RCH_2OH$ group that may be formed in-situ. The RCHO groups formed in-situ in the slurry can vary in concentration from 0.01 gm/liter to 100 gm/liter, such as 0.1 gm/liter to 10 gm/liter, and can be formed at basic pH from 8 to 11 or acidic pH from 2 to 5. The manganese oxide formed can be in form of a precipitate, or can coat soft abrasive particle surfaces.

The slurry solution can optionally also include at least one alkali metal ion (e.g., Li+, K+, and Na+) besides the per-based oxidizer. The alkali metal ion in the slurry solution is generally in a concentration from 0.01M to 10 M, with a typical range from 0.1 M to 0.5 M, or phosphate, acetate, sulfur or chlorine containing ions ranging in concentration from 0.001 M to 10 M with typical concentrations ranging from 0.01 M to 0.5 M.

The polishing rate of a wide variety of different hard materials can be appreciable using disclosed embodiments despite excluding conventionally needed hard abrasive particles. It is recognized to be important to increase the kinetics of the slurry's reaction with the hard surface to achieve high polishing rates. By adding at least one buffering agent the hard material polishing rate can be significantly enhanced. This is an unexpected result because buffering agents are known to tend to reduce the polishing rate, but disclosed slurries with such additives have been found to increase the hard material removal rate. It appears that the presence of buffering agent(s) in the slurry solution tends to catalyze the oxidation reaction of the hard layer being polished thereby leading to significantly increased polishing rates.

The polishing process can take place using a CMP apparatus when the wafer surface is rubbed with a slurry by a polymeric pad or a metal plate or ceramic plate. The flow rate of the slurry can vary from 1 ml/min to 10 liter/min with typical flow from 10 ml/min to 2,000 ml/min. The polishing pressure can vary from 0.1 psi to 20 psi with typical range from 1 psi to 10 psi. The linear velocity can vary from 0.01 m/sec to 100 m/sec with typical range from 0.4 m/sec to 5 m/sec. The temperature of the slurry can vary from 5° C. to 80° C., with a typical range from 20° C. to 50° C.

FIG. 1 is a flow chart that shows steps for an example method 100 of abrasive-free polishing of hard materials, according to an example embodiment. Step 101 comprises providing a slurry solution including ≥1 per-compound oxidizer in a concentration between 0.01 M and 2 M with a pH level from 2 to 5 or 8 to 11, and ≥1 buffering agent. The buffering agent provides a buffering ratio of at least 1.5 which compares an amount of a strong acid needed to reduce the pH from 9.0 to 3.0 compared to an amount of strong acid to change the pH from 9.0 to 3.0 without the buffering agent. The slurry solution is exclusive any hard slurry particles or has only soft slurry particles that have throughout a Vickers hardness <300 $Kg/mm^2$ or Mohs Hardness <4. Step 102 comprises dispensing the slurry solution on a hard surface having a Vickers hardness >1,000 $kg/mm^2$. Step 103 comprises pressing with a polishing pad with the slurry solution on the hard surface in between while rotating the polishing pad relative to the hard surface.

EXAMPLES

Disclosed embodiments are further illustrated by the following specific Examples, which should not be construed as limiting the scope or content of this Disclosure in any way.

Example 1

Experiments were performed using a CETR polisher from Bruker Corporation with 9-inch platen, using a rotation of the pad at 100 rotations per minute (RPM) and the sample at 60 rotations per minute (RPM) by pressing against each other with a pressure of 6.3 psi. A soft polyurethane pad (Cabot D100) with a Shore D hardness of less than 100 was used for the polishing process. A slurry with $KMnO_4$ as the per-compound oxidizer in a concentration of 0.30 moles/liter dissolved in water with a pH 1 to 13 was dispensed using peristaltic pump on the polishing pad. The slurry solution was dispensed at 30 to 40 ml/minute.

The removal rates of silicon carbide and gallium nitride, and diamond layers at different pH and concentration of the $KMnO_4$ solution are shown in the table provided in FIG. 2. This table clearly shows the high removal rate of various carbides and nitrides by the permanganate slurry. An interesting feature of this polishing process is that removal rate goes up as the pH is increased in the acidic range. A significant result for this polishing process is the result of a surface roughness 1 to 2 Å (rms) with no subsurface damage was achieved. Furthermore, this hard abrasive free composition can contain small particles of $MnO_2$ formed due to autocatalysis. The Mohs hardness for $MnO_2$ is ≤3. Thus two states of manganese ions (+7, +4) and dissolved manganese ($Mn^{2+}$) may all be present in the slurry solution. No hard abrasive particles were added to the slurry which means that no abrasives with Mohs number >3.0 or Vickers hardness >300 $kg/mm^2$ were present. It is interesting to note that high removal rates are obtained for the hard materials polished (Vickers hardness of GaN 1500 $Kg/mm^2$, SiC approximately 3,000 $Kg/mm^2$, and diamond approximately 10,000 $Kg/mm^2$) despite lacking conventionally required hard abrasives in slurry. The removal action is based upon a formation of a modified (oxidized layer) on the surface of the hard material layer which is removed by the rubbing of the pad. Applicants have seen removal or polishing of carbide/nitride surfaces when using polymeric pads with Shore Hardness D varying from 5 to 100. The removal rate was found to be linearly dependent on pressure up to 10 psi and revolution rate (10 to 300 rpm).

Example 2: Effect of Pad Pressure

Experiments were performed using a Buehler polisher with 12-inch platen, rotating the pad at 90 RPM and sample with 60 RPM and by pressing against each other with pressure varying pressure. A slurry with $KMnO_4$ as the per-compound oxidizer in a concentration of 0.1 mole/liter dissolved in water at a pH of 2 was dispensed during the polishing experiment using peristaltic pump. A polyurethane pad (Cabot D100) was used for this polishing process with Shore D hardness of approximately 40 The removal rates of c-face SiC wafers with different pad pressures using the above-mentioned process is shown in the table below. It should be noted that polymeric pads with a Shore D hardness ranging from 10 to 100 or Shore A hardness ranging from 5 to 100 are expected to give rise to high polishing rates for such slurries.

| Pressure psi | SiC—C— face@ pH~2 Removal rate (nm/h) |
|---|---|
| 0.5 | 350 |
| 2.0 | 2,400 |
| 6.36 | 5,450 |
| 9.55 | 7,880 |
| 12.73 | 9,880 |
| 15.92 | 10,730 |

The SiC removal rate was found to be approximately linear with pressure. The removal rate of c-face SiC was found to be much higher than Si-face. It is believed that these good results are because of strong interaction of the permanganate ions with carbon and nitrogen based bonds, with such bonds being susceptible to oxidation of the surface.

Example 3: Effect of Temperature

Experiments were performed using a Buehler polisher with 12-inch platen, rotating the pad at 90 RPM and the sample at 60 RPM by pressing against each other with a pressure of 6.3 psi. A slurry with $KMnO_4$ as the per-compound oxidizer in a concentration of 0.4 mole/liter dissolved in water at a pH of 2. The solution was heated to different temperatures using a hot plate. The heated solution at different temperatures was dispensed during the polishing experiment using a peristaltic pump. A polyurethane pad (Cabot D100) was used for this polishing process. The removal rates c-face SiC wafers with different temperatures using the above-mentioned process is shown in the table below. It should be noted that polymeric pads with Shore D hardness ranging from 10 to 100 or Shore A hardness ranging from 5 to 100 are expected to give rise to polishing rates for such slurries.

| Temperature | SiC—C— face@ pH~2 Removal rate (μm/h) |
|---|---|
| 25° C. | 7.3 |
| 50° C. | 7.7 |

The polishing temperature can vary from 10° C. to 50° C., however no strong temperature dependence was observed.

Example 4: Effect of Salt Addition

Experiments were performed using a Buehler polisher with 12-inch platen, rotating the pad at 90 RPM and the sample at 60 RPM and by pressing against each other with a pressure of 6.3 psi. A slurry with $KMnO_4$ as the per-compound oxidizer in a concentration of 0.05 mole/liter and different (organic and inorganic) salts with different concentrations was dissolved in water at a pH of 1.6. This mixed slurry solution was dispensed on the pad during the polishing experiment using a peristaltic pump. A polyurethane pad (Cabot D100) was used for this polishing process. The removal rates C-face SiC wafers with different salt addition, using the above-mentioned process is shown in the table below.

| Salt | Salt Concentration | SiC—c— face@ pH 1.6 Removal rate (nm/h) |
|---|---|---|
| No salt | 0 | 4,506 |
| NaCl | 0.2 mol | 3,618 |
| KCl | 0.2 mol | 3,656 |
| $K_2SO_4$ | 0.1 mol | 3,900 |
| KNO3 | 0.15 mol | 4,205 |
| $Na_2HPO_4$ | 0.01 mol | 3,560 |
| $CH_3COONa$ | 0.01 mol | 3,500 |

The above salts were found to decrease the removal rates, however a better uniformity in polishing was observed.

Example 5: Effect of Pads

Experiments were performed using a Buehler polisher with 12-inch platen, rotating the pad at 90 RPM and the sample at 60 RPM by pressing against each other with a pressure of 6.3 psi. A slurry with $KMnO_4$ as the per-compound oxidizer in a concentration of 0.1 mole/liter dissolved in water at pH of 2 was dispensed on the pad during the polishing experiment using a peristaltic pump. The experiments were performed using polishing pads made of polyurethane, poromeric, copper composite (copper and epoxy) and metals places copper and cast iron. The poromeric pad is composed of a polymer with Shore hardness A of less than 20. The removal rates C-face SiC and Ga-face GaN wafers with use of different pad type using the above-mentioned process is shown in the table below.

| Pad | SiC—C— face@ pH~3, Removal rate (μm/h) | GaN Ga-face @ pH~1.5, Removal rate (μm/h) |
|---|---|---|
| Polyurethane | 5.38 | 0.3 |
| Poromeric pads | 7.7 | 0.25 |
| Copper Composite | 0.66 | 0.15 |
| Copper plate | 0.55 | 0.1 |
| Cast Iron | 0.66 | 0.1 |

The hardness of the polymeric pads can be varied from Asker C-20 to Asker –100 and shore D hardness from 10 to 100. Substantial removal of material was observed. Cast iron and copper plates were found to give lower removal rates compared to pads. Corrosion inhibitors such as amines and azoles (benzo triazole (BTA) were added to the slurry to reduce its corrosive properties but it did not significantly decrease the polishing rates.

Example 6: Polishing of Different Materials

Experiments were performed using a CETR-CP-4 polisher with 9-inch platen, rotating the pad at 100 RPM and the sample at 60 RPM by pressing against each other with a pressure of 6.3 psi. A slurry with $KMnO_4$ as the per-compound oxidizer in a concentration of 0.03 to 1.5 mole/liter dissolved in water at a pH of 2 was dispensed on the pad during the polishing experiment using a peristaltic pump. An IC 1000 polishing pad from DOW Electronic materials comprising a micro-porous polyurethane material was used. The experiments were performed using different hard substrates and the removal rates achieved on each substrate is shown in the table below.

| Material | Oxidizer Concentration (mole/liter) | pH | Removal rate (μm/h) |
|---|---|---|---|
| AlGaN | 0.05 | 2-3 | 0.35 |
| Al-85%, Ga-15% | 0.50 | 2-3 | 1.7 |
| AlN | 1.50 | 2-3 | 0.95 |
| Ruthenium (Ru) | 1.5 | 2 | 0.1 |
| Ruthenium (Ru) | 0.5 | 3 | 0.12 |
| Tungsten (W) | 0.1 | 2 | 0.06 |
| Iridium (Ir) | 0.1 | 2 | 0.05 |
| Tantalum (Ta) | 0.1 | 4 | 0.02 |

This data shows that a $KMnO_4$ slurry without hard abrasive particles provides significant removal of material from both AlGaN and metal surfaces.

Example 7 Effect of Additives

Experiments were performed using a Buehler polisher with 12 inch platen, rotating speed of the pad at 90 RPM and the sample of on axis poly-crystalline silicon carbide at 60 RPM by pressing against each other with a pressure of 6.3 psi. A slurry with $KMnO_4$ as the per-compound oxidizer in a concentration of 0.3 mole/liter was dissolved in water at a pH of 3 was mixed with different surfactants, concentration of organic compounds with OH groups and $Mn^{2+}$ ions was dispensed on the pad during the polishing experiment using a peristaltic pump. The experiments were performed using different substrates and the removal rates with each additive normalized to a 0.25 mole/liter $KMnO_4$ solution is shown in the table below.

| Additive/Concentration | pH | Removal rate 0.25 mol/liter $KMnO_4$ solution |
|---|---|---|
| 0.25 mole/liter KMnO4 | 1.5 | 0.66 |
| 0.25 mole/liter KMnO4 | 3 | 0.5 |
| 0.25 mole/liter KMnO4 | 5 | 0.45 |
| Cationic Surfactant: Cetrimonium bromide (C12TAB) (0.01 g/L) | 3 | 0.7 |
| Cationic Surfactant: Cetyl ammonium bromide (C12TAB) (5 g/L) | 3 | 0.58 |
| Non-ionic surfactant: Pentaethylene glycol monododecyl ether (0.2 g/L) (Brij-35) | 9 | 0.75 |
| Non-ionic surfactant Pentaethylene glycol monododecyl ether (1 g/L) (Brij-35) | 3 | 0.87 |
| Non-ionic surfactant: Octaethylene glycol monododecyl ether (0.3 g/L) (Brij) | 3 | 0.69 |
| Non-ionic surfactant: Octaethylene glycol monododecyl ether (5 g/L) KMnO4 (Brij-35) | 3 | 0.73 |
| Anionic Surfactant: Sodium dodecyl + 0.12 g/L) | 3 | 0.71 |
| Anionic Surfactant: Sodium dodecyl + 4 g/L) | 3 | 0.61 |
| Non-Ionic surfactant Polyethylene glycol octylphenyl ethers. TX100 + 4 gm/L | 10 | 0.33 |
| Non-Ionic surfactant Polyethylene glycol octylphenyl ethers. TX100 + 0.1 gm/L | 3 | 0.77 |
| Non-Ionic surfactant Polyethylene glycol octylphenyl ethers. TX100 + 0.1 gm/L | 5 | 0.93 |
| Bicine N,N-bis (2-hydroxyehyl) 1 glycine 1 g/L) | 7.5 | 0.57 |
| Bicine N,N-bis (2-hydroxyehyl) glycine 0.5 g/L) | 3 | 0.85 |
| Bicine N,N-bis (2-hydroxyehyl) glycine 1 g/L) | 3 | 0.69 |
| 0.03 mole Manganese Chloride Hexahydrate (MnCl2•6H20) | 3 | 0.62 |

Various additives with different concentration were added for 0.25 mole $KMnO_4$ disclosed slurries. The removal rates were found to decrease with additives at lower pH but appear to be the same or higher at higher pH (e.g., pH ~5). As disclosed above the BR is defined as the strong acid required to reduce pH from 9 to 5 when compared to the same slurry with no buffer agent added. For non-ionic surfactants, the BR was between 1.0 and 10.0 depending on the concentration of the non-ionic surfactant. The ability to have a high BR is advantageous as it leads to constant pH along the polishing process. The addition of organic additives such as bicine as a buffering agent with surfactants seems to increase the buffering ratio. With bicine a BR of 1.2 was observed (0.05 gm/liter) while a BR of 5.6 was obtained with TX-100 (a non-ionic surfactant that has a hydrophilic polyethylene oxide chain and an aromatic hydrocarbon lipophilic or hydrophobic group). In this case a higher removal rate was obtained.

Example 8 Effect of Multiple Manganese Ion Valence States

Experiments were performed using a Buehler polisher with 12 inch platen, rotating speed of the pad at 90 RPM and the sample being on axis 4H silicon carbide Si-face wafer at 60 RPM by pressing against each other with a pressure of 6.3 psi. A slurry with $KMnO_4$ as the per-compound oxidizer in a concentration of 0.3 M was dissolved in water at a pH of 3 mixed with soft oxides of manganese oxide (such as $MnO_2$) with a Vickers hardness less than 200 Kg/mm² or Mohs hardness less than 3 with charges states $Mn^{2+}$, $Mn^{3+}$, $Mn^{4+}$ and $Mn^{7+}$ that was dispensed on the pad during the polishing experiment using a peristaltic pump. A polyurethane pad (Cabot D100) was used for this polishing process. The experiments were performed using different substrates and the removal rates with each additive normalized to 0.3 mole/liter of $KMnO_4$ solution is shown in the table below.

| 0.1 mole/liter $KMnO_4$ | pH | Removal rate 0.3 mol/ liter $KMnO_4$ solution |
|---|---|---|
| 0.1 mole/litter $KMnO_4$ | 3 | 0.2 |
| 1 gm/liter of Manganese(II) oxide, MnO | 3 | 0.2 |
| 1 gm/liter of Manganese(III) oxide | 3 | 0.201 |
| 1 gm/liter of Manganese(IV) oxide | 3 | 0.23 |
| 1 gm/liter of Manganese(VII) oxide, $Mn_2O_7$ | 3 | 0.23 |

These results show that addition of $Mn^{+4}$ increases the rate of polishing process. The presence of multivalent manganese ions also can be seen to help the polishing process. It should be noted that polymeric pads with Shore D hardness ranging from 10 to 100 or a Shore A hardness ranging from 5 to 100 are expected to give rise to polishing rates for such slurries.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

The invention claimed is:

1. A slurry for chemical-mechanical polishing (CMP), comprising:
   an aqueous medium;
   at least one pre-compound permanganate oxidizer that includes an element in its highest oxidation state with a concentration between 0.01 M and 2.0 M;
   a pH level from 8 to 11;
   at least one buffering agent different from said per-compound oxidizer, the buffering agent comprising at least one of a surfactant and an alkali metal ion; and
   particles of $MnO_2$ having a Mohs hardness of ≤3,
   wherein said slurry is exclusive of any particles that have a Mohs hardness >3.

2. The slurry of claim 1, wherein said slurry further comprises transition metal ions in a concentration from 0.03 M to 1 M in addition to any transition metal ions that may be in said per-compound permanganate oxidizer.

3. The slurry of claim 1, wherein said particles of $MnO_2$ having a Mohs hardness ≤3 are particles formed in-situ by autocatalysis.

4. The slurry of claim 1, wherein said buffering agent comprises said surfactant and at least 2 different valence states of Mn ions including said per-compound permanganate oxidizer chosen from +7, +4, +2, and +3.

5. The slurry of claim 1, wherein said per-compound permanganate oxidizer comprises potassium permanganate or sodium permanganate.

6. A slurry for chemical-mechanical polishing (CMP), comprising:
   an aqueous medium;
   at least one pre-compound permanganate oxidizer that includes an element in its highest oxidation state with a concentration between 0.01 M and 2.0 M;
   a pH level from 2 to 5 or from 8 to 11;
   at least one buffering agent different from said per-compound oxidizer, the buffering agent comprising at least one of a surfactant and an alkali metal ion; and
   particles of $MnO_2$ having a Mohs hardness of ≤3,
   wherein said slurry is exclusive of any particles that have a Mohs hardness >3, and
   wherein the buffering agent comprises a species having the formula RCHO, wherein R is a carbon containing group.

\* \* \* \* \*